US009230820B2

(12) United States Patent
Ruiz et al.

(10) Patent No.: US 9,230,820 B2
(45) Date of Patent: *Jan. 5, 2016

(54) METHOD FOR DIRECTED SELF-ASSEMBLY (DSA) OF A BLOCK COPOLYMER (BCP) USING A BLEND OF A BCP WITH FUNCTIONAL HOMOPOLYMERS

(71) Applicant: HGST Netherlands B.V., Amsterdam (NL)

(72) Inventors: Ricardo Ruiz, Santa Clara, CA (US); Lei Wan, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/707,315

(22) Filed: May 8, 2015

(65) Prior Publication Data
US 2015/0243514 A1   Aug. 27, 2015

Related U.S. Application Data

(63) Continuation-in-part of application No. 14/067,769, filed on Oct. 30, 2013, now Pat. No. 9,054,043.

(51) Int. Cl.
G03F 7/26 (2006.01)
H01L 21/308 (2006.01)
(Continued)

(52) U.S. Cl.
CPC .......... *H01L 21/3086* (2013.01); *C09D 153/00* (2013.01); *H01L 21/0272* (2013.01);
(Continued)

(58) Field of Classification Search
CPC .............. H01L 21/3086; H01L 21/31138; H01L 21/31058; H01L 21/0337; H01L 21/0338; H01L 21/02118; H01L 21/0272; H01L 21/3081; H01L 21/0273; C09D 153/00; B82Y 40/00; B82Y 30/00; G03F 7/0002; G03F 7/165; G03F 7/40; G03F 7/038; B81C 2201/0149; B81C 1/00031; B81C 2201/0198; C08L 53/00; C08L 2666/02; C08L 2666/24; Y10S 9777/70
USPC ......................................... 430/322, 323, 324
See application file for complete search history.

(56) References Cited

U.S. PATENT DOCUMENTS 7,976,715 B2   7/2011   Dobisz et al.
8,059,350 B2   11/2011  Albrecht et al.
(Continued)

OTHER PUBLICATIONS

Ruiz, et al., "Induced Orientational Order in Symmetric Diblock Copolymer Thin Films", Advanced Materials 2007, 19, (4), 587.
(Continued)

*Primary Examiner* — Caleen Sullivan
(74) *Attorney, Agent, or Firm* — Thomas R. Berthold

(57) ABSTRACT

A method for directed self-assembly (DSA) of block copolymers (BCPs) uses a BCP blend with a small portion of functional homopolymers, called "inks", before deposition and annealing of the BCP. A substrate has a patterned sublayer formed on it. The BCP blend is deposited on the patterned sublayer and annealed. The BCP blend is guided by the sublayer pattern. The inks selectively distribute into blocks, and part of the inks graft on the substrate underneath the blocks. The BCP blend layer is rinsed away, leaving the grafted inks. The grafted inks form a chemical contrast pattern that has the same geometry with the BCP bulk morphology. This process is repeated, which results in the grafted inks forming a thicker and denser chemical contrast pattern. This chemical contrast pattern of grafted inks is used for the DSA of a BCP that self-assembles as lamellae perpendicular to the substrate.

20 Claims, 11 Drawing Sheets

(51) Int. Cl.
*H01L 21/027* (2006.01)
*C09D 153/00* (2006.01)
*H01L 21/02* (2006.01)
*H01L 21/033* (2006.01)
*H01L 21/3105* (2006.01)
*H01L 21/311* (2006.01)

(52) U.S. Cl.
CPC ...... *H01L21/0273* (2013.01); *H01L 21/02118* (2013.01); *H01L 21/0337* (2013.01); *H01L 21/0338* (2013.01); *H01L 21/3081* (2013.01); *H01L 21/31058* (2013.01); *H01L 21/31138* (2013.01)

(56) References Cited

U.S. PATENT DOCUMENTS

| | | | |
|---|---|---|---|
| 8,119,017 | B2 | 2/2012 | Albrecht et al. |
| 8,790,522 | B1 | 7/2014 | Schmid et al. |
| 8,828,493 | B2 | 9/2014 | Cheng et al. |
| 2008/0299353 | A1 | 12/2008 | Stoykovich et al. |
| 2009/0087653 | A1 | 4/2009 | Nealey et al. |
| 2009/0260750 | A1 | 10/2009 | Nealey et al. |
| 2014/0353762 | A1 | 12/2014 | Guillorn et al. |
| 2015/0118851 | A1 | 4/2015 | Gao et al. |

OTHER PUBLICATIONS

Ji, et al., "Molecular Transfer Printing Using BlockCopolymers", Acs Nano, 2010, 4, (2) 599-609.

Wan et al., "Fabrication of templates with rectangular bits on circular tracks by combining block copolymer directed self-assembly and nanoimprint lithography", Journal Micro/Nanolithography, MEMS, and MOEMS, 2012, 11, (3), 031405 (Jul.-Sep. 2012).

Tsai, et al., "Two-Dimensional Pattern Formation Using Graphoepitaxy of PS•b•PMMA Block Copolymers for Advanced FinFET Device and Circuit Fabrication", ACS Nano, vol. 8, No. 5, 5227-5232 2014.

Jeong et al., "Directed self-assembly of block copolymers for next generation nanolithography", Materials Today vol. 16, No. 12, Dec. 2013, pp. 468-476.

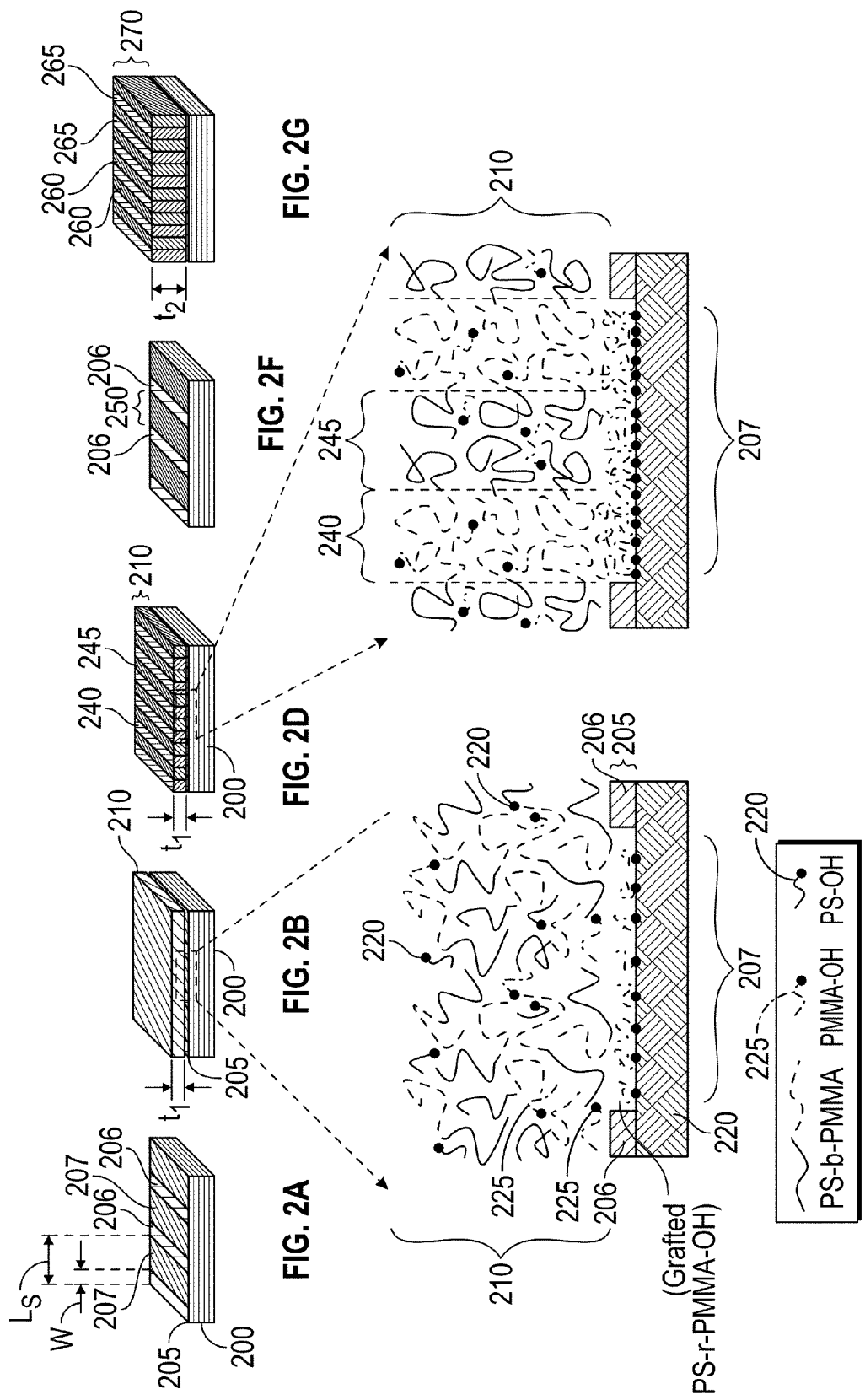

METHOD FOR DIRECTED SELF-ASSEMBLY (DSA) OF A BLOCK COPOLYMER (BCP) USING A BLEND OF A BCP WITH FUNCTIONAL HOMOPOLYMERS

RELATED APPLICATION

This application is a continuation-in-part of application Ser. No. 14/067,769, filed Oct. 13, 2013.

BACKGROUND OF THE INVENTION

1. Field of the Invention

This invention relates generally to the directed self-assembly (DSA) of block copolymers (BCPs), and more particularly to the DSA of BCPs to make an etch mask for pattern transfer into a substrate.

2. Description of the Related Art

Directed self-assembly (DSA) of block copolymers (BCPs) has been proposed for generating patterns in semiconductor manufacturing, for example, for patterning parallel generally straight lines in MPU, DRAM and NAND flash devices, and more recently for patterning parallel line arrays for FinFET devices. DSA of BCPs can also be used for making imprint templates, which have application in making patterned-media magnetic recording disks and semiconductor devices. DSA of BCPs by use of a patterned sublayer for the BCP film is well-known. After the BCP components self-assemble on the patterned sublayer, one of the components is selectively removed, leaving the other component with the desired pattern, which can be used as an etch mask to transfer the pattern into an underlying substrate. The etched substrate can be used as an imprint template.

With the prior art method of DSA of BCP thin films, the quality of the self-assembled pattern depends upon a number of factors, including film thickness, the acceptable defect density, the density multiplication factor, the chemistry of the patterned sublayer and individual stripe width of the patterned sublayer. The design of a process to have a large process window for one parameter usually implies that the process window for the other parameters gets reduced or compromised. For example, thicker BCP films are desirable for pattern transfer into the template; however, a thicker film results in higher defect densities or in a lower tolerance for a high density multiplication factor. Conversely, if a higher density multiplication factor is desired, or if more tolerance is needed for the width of the stripes, the film thickness needs to be reduced considerably to avoid a large defect density.

What is needed is an improved method for DSA of BCPs that allows for a large process window.

SUMMARY OF THE INVENTION

Embodiments of the invention relate to a method for DSA of BCPs, using either chemoepitaxy or graphoepitaxy to form the BCP patterns. For a DSA process, a conventional lithography process is used to generate a patterned sublayer as a guiding pattern on which BCPs form more uniform and/or denser patterns. The patterned sublayer may be a chemical contrast pattern (chemoepitaxy) or a topographic pattern (graphoepitaxy). A BCP blend with a small portion of functional homopolymers is then deposited on the patterned sublayer and annealed. A functional homopolymer, referred to as an ink, is typically the same as one of the BCP blocks. After annealing, the BCP blend will be guided by the sublayer pattern (either the chemical contrast pattern or the topographic pattern). The inks will selectively distribute into blocks, and part of the inks will graft on the substrate underneath the blocks. The BCP blend layer is then rinsed away, leaving the grafted inks. This results in the grafted inks forming a chemical contrast pattern that has the same geometry with the BCP bulk morphology. This process can be repeated at least once, which results in the grafted inks forming a thicker and denser chemical contrast pattern of grafted inks. This chemical contrast pattern of grafted inks is now used for the DSA of a BCP that self-assembles as lamellae perpendicular to the substrate. After removal of one of the BCP blocks the pattern of remaining BCP block can serve as mask for patterning other layers.

For a fuller understanding of the nature and advantages of the present invention, reference should be made to the following detailed description taken together with the accompanying figures.

BRIEF DESCRIPTION OF THE DRAWING

FIGS. 2A-2G are illustrations of an embodiment of the invention using a chemical contrast pattern as the patterned sublayer, wherein FIGS. 2A, 2B, 2D, 2F and 2G are perspective views of the structure at various stages of the process, FIG. 2C is an expanded sectional view of a portion of FIG. 2B, and FIG. 2E is an expanded sectional view of a portion of FIG. 2D.

DETAILED DESCRIPTION OF THE INVENTION

Figure 1A:
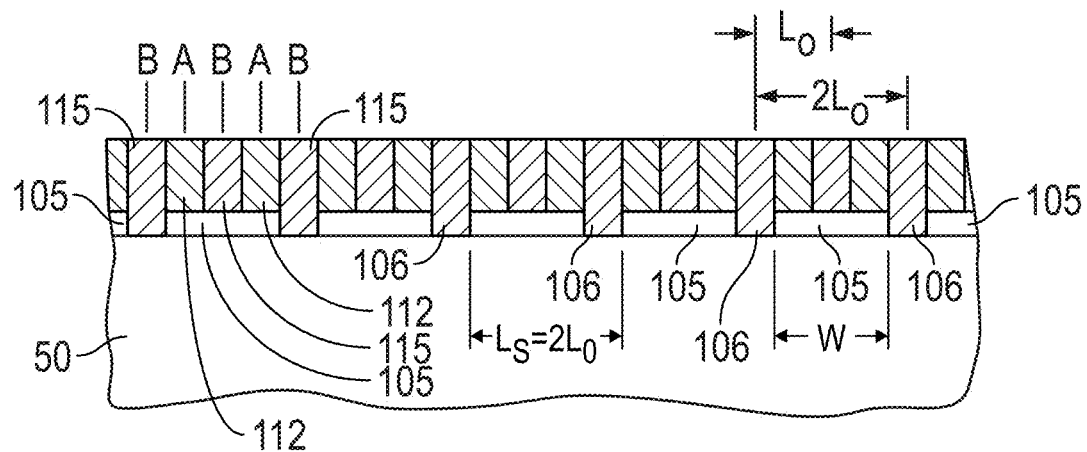
FIGS. 1A-1D are view illustrating the prior art method for making an imprint template using directed self-assembly (DSA) of block copolymers (BCPs).

Self-assembling block copolymers (BCPs) have been proposed for creating periodic nanometer (nm) scale features. Self-assembling BCPs typically contain two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of BCPs that can be used for forming the self-assembled periodic patterns. If one of the components A or B is selectively removable without having to remove the other, then an orderly arranged structural units of the un-removed component can be formed.

Specific examples of suitable BCPs that can be used for forming the self-assembled periodic patterns include, but are not limited to: poly(styrene-block-methyl methacrylate) (PS-b-PMMA), poly(ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), poly(styrene-block-lactic acid) (PS-b-PLA) and poly(styrene-block-dymethylsiloxane) (PS-b-PDMS).

The specific self-assembled periodic patterns formed by the BCP are determined by the molecular volume ratio between the first and second polymeric block components A and B. When the ratio of the molecular volume of the second polymeric block component B over the molecular volume of the first polymeric block component A is less than about 80:20 but greater than about 60:40, the BCP will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the BCP will form alternating lamellae composed of the first and second polymeric block components A and B. When the ratio of B over A is greater than about 80:20 the BCP will form an ordered array of spheres in a matrix of the second component. For lamellar or cylinder forming BCPs, the orientation of the lamellae or the cylinders with respect to the substrate depends on the interfacial energies (wetting properties) of the block copolymer components at both the substrate interface and at the top interface. When one of the block components preferentially wets the substrate (or the top free interface) the block copolymers form layers parallel to the substrate. When the wetting properties at the interface are neutral to either block, then both block components can be in contact with the interface, facilitating the formation of block copolymer domains with perpendicular orientation. In practice, the wetting properties of the substrate are engineered by coating the substrate with "surface modification layers" that tune the wetting properties at the interface. Surface modification layers are usually made of polymer brushes or mats typically (but not necessarily) composed of a mixture of the constituent block materials of the BCP to be used.

The periodicity or natural pitch ($L_0$) of the repeating structural units in the periodic pattern BCP components is determined by intrinsic polymeric properties such as the degree of polymerization N and the Flory-Huggins interaction parameter $\chi$. $L_0$ scales with the degree of polymerization N, which in turn correlates with the molecular weight M. Therefore, by adjusting the total molecular weight of the BCP, the natural pitch ($L_0$) of the repeating structural units can be selected. To form the self-assembled periodic patterns, the BCP is first dissolved in a suitable solvent system to form a BCP solution, which is then applied onto a surface to form a thin BCP layer, followed by annealing of the thin BCP layer, which causes phase separation between the different polymeric block components contained in the BCP. The solvent system used for dissolving the BCP and forming the BCP solution may comprise any suitable non-polar solvent, including, but not limited to: toluene, propylene glycol monomethyl ether acetate (PGMEA), propylene glycol monomethyl ether (PGME), and acetone. The BCP solution can be applied to the substrate surface by any suitable techniques, including, but not limited to: spin casting, coating, spraying, ink coating, dip coating, etc. Preferably, the BCP solution is spin cast onto the substrate surface to form a thin BCP layer. After application of the thin BCP layer onto the substrate surface, the entire substrate is annealed to effectuate microphase segregation of the different block components contained by the BCP, thereby forming the periodic patterns with repeating structural units. The BCP films in the above-described techniques self-assemble without any direction or guidance. This undirected self-assembly results in patterns with defects so it is not practical for applications that require long-range ordering, such as imprint templates for bit-patterned media or integrated circuits.

However, directed self-assembly (DSA) of block copolymers (BCPs) has been proposed for making generally parallel lines that can be used as an etch mask. The etch mask can be used in the manufacturing of integrated circuits to pattern intermediate layers formed on a semiconductor wafer substrate. For example, DSA of BCP has been proposed for making FinFET devices. A FinFET is composed of an array of discrete single crystal Si mesas or "fins" having widths on the order of 10 nm and heights in the 20-40 nm range. This is described in Tsai, et al., "Two-Dimensional Pattern Formation Using Graphoepitaxy of PS-b-PMMA Block Copolymers for Advanced FinFET Device and Circuit Fabrication", ACS Nano, Vol. 8, No. 5, 5227-5232 2014. The etch mask can also be used to make imprint templates, which can be used in making integrated circuits and patterned-media magnetic recording disks. For example, U.S. Pat. No. 7,976,715 and U.S. Pat. No. 8,119,017, both assigned to the same assignee as this application, describe DSA of BCPs for making imprint templates with radial lines and concentric circular lines that are used to make patterned-media magnetic recording disks.

Figure 1B:
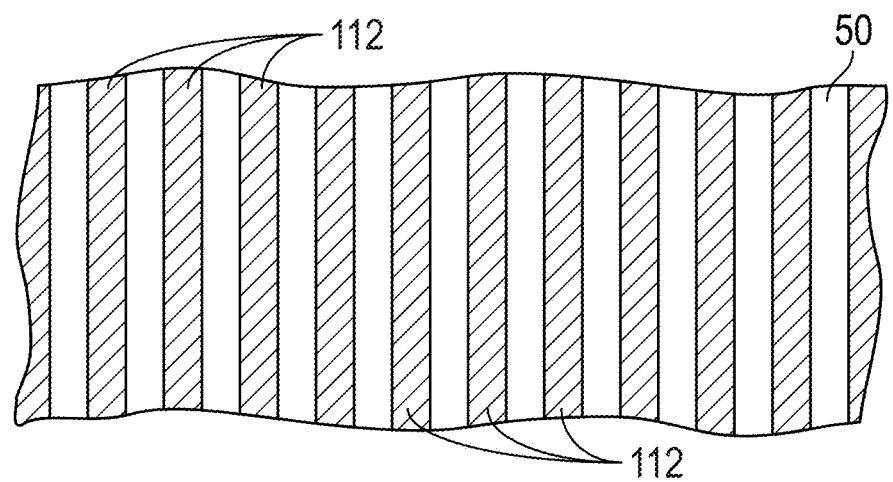
Figure 1C:
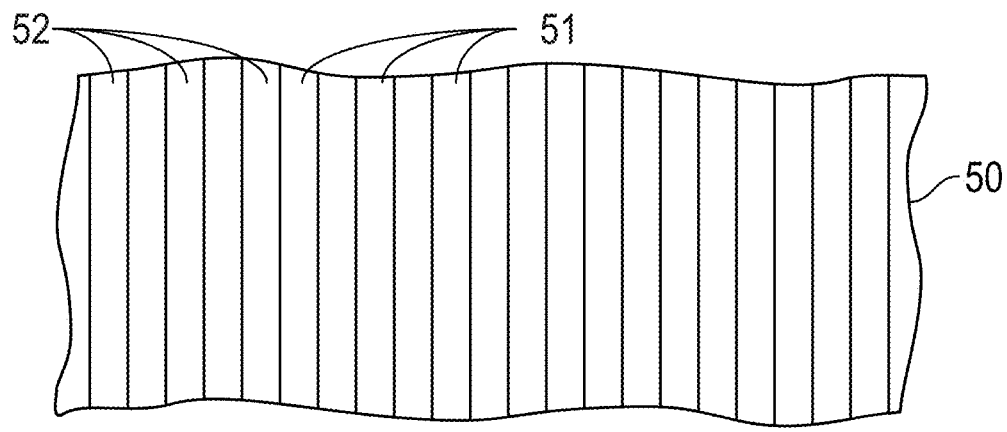
Figure 1D:
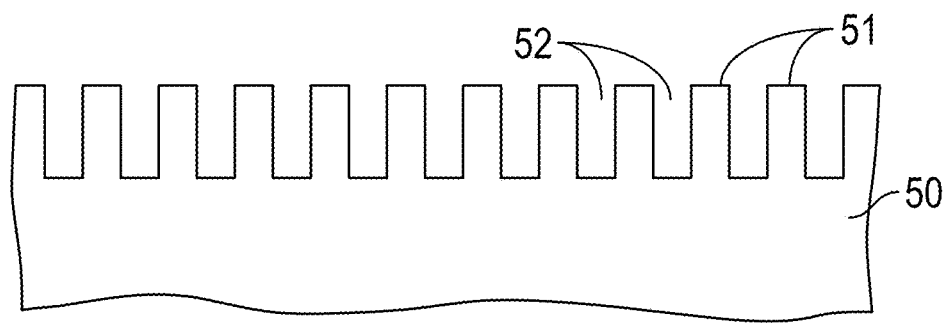

The prior art method for making an imprint template using DSA of BCPs will be described in general terms with FIGS. 1A-1D for an example where the template 50 will become an imprint template with protrusions 51 in a pattern of parallel bars. FIG. 1A is a side sectional view showing the template 50 with a patterned sublayer of generally parallel stripes 105 and intermediate substrate regions 106. In this example the patterned sublayer is a chemical contrast pattern, so the method of forming the BCP pattern is by chemoepitaxy. Alternating A component polystyrene (PS) parallel lines 112 and B component (PMMA) parallel lines 115 are formed as lamellae perpendicular to the substrate 50 over the stripes 105 and substrate regions 106. The regions 106 can be exposed portions of the template 50 not covered by sublayer 105 or regions covered by a different sublayer. The sublayer has been patterned to direct the self-assembly of the BCP A and B components with a natural pitch of $L_0$. In this example the stripes 105 have a width W of $1.5L_0$ and a stripe pitch $L_S$ of $2L_0$. In FIG. 1B, the portions of parallel lines 115, the B component (PMMA), are then selectively removed by a wet etch or a dry etch process. This leaves generally parallel lines 112 of the A component (PS) on the template 50. Then, a dry etch process is used to etch the template 50 to form recesses 52 using the parallel lines 112 as the etch mask. The material of parallel lines 112 and the remaining underlying sublayer 105 is then removed, leaving recesses 52 in template 50. This leaves the structure as shown in FIG. 1C, with a pattern of protrusions formed as parallel bars 51 and recesses formed as parallel bars 52. FIG. 1D is a side sectional view of the resulting imprint template.

With this prior art method of DSA of BCPs, the quality of the self-assembled pattern depends upon a number of factors, including the BCP film thickness, the acceptable defect density, the density multiplication factor "n" where $L_S=nL_0$, the chemistry of the patterns, and the width W of the individual stripes relative to $L_0$. The design of a process to have a large process window for one parameter usually implies that the process window for the other parameters gets reduced or compromised. For example, thicker BCP films (about 1-2 times the $L_0$) are desirable for pattern transfer into the template. However, a thicker BCP film results in higher defect densities or in a lower tolerance for a high density multiplication factor. Conversely, if a higher density multiplication factor is desired, or if more tolerance is needed for the width of the stripes, the BCP film thickness needs to be reduced considerably to avoid a large defect density. In general, it is known that when the chemical contrast patterns of the patterned sublayer are written at the same density as the resulting block copolymer pattern (i.e., $L_S=L_0$), the DSA results in the lowest defect densities with the largest tolerance for stripe pattern variation or for a wide range of film thicknesses. However, it can be difficult to form a chemical contrast pattern as the patterned sublayer with such a small stripe pitch. Thus it is desirable to have chemical contrast patterns with a high density multiplication factor (n greater than or equal to 2) that can still allow the use of thicker BCP films and result in low defect densities.

Embodiments of the method of this invention use intermediate steps between formation of the patterned sublayer and deposition of the BCP and thus replace the prior art method illustrated and described above with respect to FIG. 1A. The method is illustrated in FIGS. 2A-2F for an example where the BCP is poly(styrene-block-methyl methacrylate) (PS-b-PMMA) with $L_0=27$ nm.

FIG. 2A is a perspective view of a substrate 200 with a patterned sublayer 205 that acts as a chemical contrast pattern. The substrate 200 may be formed of any suitable material, such as, but not limited to, silicon-on-insulator (SOI), single-crystal Si, amorphous Si, silica, fused quartz, silicon nitride, carbon, tantalum, molybdenum, chromium, alumina and sapphire. The substrate may also be an intermediate layer formed on a semiconductor wafer or SOI base, such as an amorphous carbon layer or a silicon nitride (SiN) layer. The previously-cited Tsai et al. article describes the use of DSA to form a BCP pattern on a SiN layer above a SOI base for making an etch mask to pattern fins in FinFET devices.

In case of the DSA of perpendicularly oriented lamellae, a patterned sublayer 205 is typically a periodic pattern of generally parallel stripes 206 with a stripe pitch $L_S$ approximately equal to $nL_0$ and alternate stripes 207. Because it may not be possible to precisely match the width and spacing of the resist stripes during the e-beam lithographic process that forms the patterned sublayer 205, the phrase "approximately" as used herein in reference to the stripe widths, spacing and pitch shall mean the referenced term plus or minus 10%. One of the stripes (206) is typically preferentially wetted by one of the blocks, which are called the guiding stripes. The chemistry of the alternate stripes (207) is tuned accordingly, depending on the chemistry of the guiding stripes 206. When stripes 206 and 207 have approximately the same height, they are typically referred to as chemical contrast patterns and the method for forming the BCP patterns is referred to as chemoepitaxy.

In the prior art, there are various types of chemical contrast patterns specifically for PS-b-PMMA, which means different pairing of 206 and 207 stripes. For instance, the 206 and 207 stripes can be exposed silicon substrate and a PS-rich functionalized random copolymer PS-r-PMMA brush, respectively; exposed silicon substrate and a low molecular weight functionalized PS brush, respectively; exposed silicon substrate and a PS-rich crosslinked random copolymer PS-r-PMMA mat, respectively; crosslinked PMMA mat and a PS-rich functionalized random copolymer PS-r-PMMA brush, respectively; crosslinked PS mat and a PMMA-rich functionalized random copolymer PS-r-PMMA brush, respectively; e-beam resist HSQ (hydrogen silsesquioxane) and a PS-rich functionalized random copolymer PS-r-PMMA brush, respectively; a functionalized PS brush and a PMMA-rich crosslinked random copolymer PS-r-PMMA mat, respectively; or a functionalized PMMA brush and a PS-rich crosslinked random copolymer PS-r-PMMA mat, respectively.

A mat layer is a crosslinked polymer layer. The crosslinkable polymer may be spin-coated on the substrate to a thickness of 4-15 nm. The as-spun film is then annealed or treated by UV light for the cross-linking units to carry out the cross-linking After cross-linking, the cross-linked polymer layer is typically referred as a mat layer. The film thickness is similar to that of the as-spun layer. A brush layer is a monolayer of a functional polymer grafted on the substrate. The functional polymer may be applied on the substrate to a thickness greater than 5 nm. The as-spun film is annealed for the functional groups to graft to the substrate surface. After annealing, any ungrafted brush material is rinsed away in a suitable solvent (e.g., toluene, PGMA, or NMP). The thickness of the brush layer is typically 1-15 nm, which is determined by the properties of the functional polymer such as chemistry, molecular weight, location of the functional group, etc. One of the main differences between these two is that a mat layer is denser than a brush layer and can prevent a further brush grafting on the underlying substrate surface. In embodiments of this invention, since the additive brush grafting on the original chemical contrast patterns is required, at least part of the chemical contrast patterns is a brush layer or bare substrate surface.

For DSA, additional steps are required to create a chemical contrast pattern. These steps may include e-beam lithography, photolithography or nanoimprint lithography and potentially a combination of polymer mats and brushes. Referring again to FIG. 2A, in the present example, a layer of cross-linked polystyrene XPS (205) with a thickness of 5-8 nm is first formed on a silicon substrate, followed by deposition of an e-beam resist layer on top. E-beam lithography is utilized to generate grating patterns with a stripe pitch $L_S = nL_0$. The resist pattern is then exposed to oxygen plasma etching so that the exposed portions of the XPS layer are etched away. Meanwhile, the width of the resulted XPS stripes (206) is also tuned by lateral etching. The remaining resist pattern is rinsed away in a suitable solvent (e.g., toluene, PGMA, or NMP). A functionalized random copolymer "PS-r-PMMA" with a hydroxyl (OH) group (e.g., PS-r-PMMA-OH) consisting of ~50% styrene is then spin-coated on the substrate and annealed. Since XPS stripes are dense, PS-r-PMMA-OH can only graft in the intermediate regions between XPS stripes (206). After rinsing away the ungrafted brush material in toluene or NMP, the remaining brush forms stripes 207 of grafted PS-r-PMMA-OH.

Next, in FIG. 2B and the expanded sectional view of FIG. 2C a solution of a BCP blended with homopolymers with functional groups is deposited, for example by spin-coating, as a thin film 210 onto the chemical contrast pattern 205. Preferably the homopolymers with functional groups are the same as the polymers in the BCP and the functional groups are functional end groups. The preferred BCPs are PS-b-PMMA and polystyrene block poly 2-vinylpyridine (PS-b-P2VP). The preferred functional groups for the homopolymers are hydroxyl (OH) and amine ($NH_2$). This layer is deposited to a thickness in the range of 10 to 20 nm, substantially less than $L_0$. The functionalized homopolymers are sometimes called "inks" because they are added to the blend.

In the example of FIGS. 2A-2G, the BCP is PS-b-PMMA and the homopolymers are OH-terminated PS (item 220) and OH-terminated PMMA (item 225). The blend may be made up of 70-99% PS-b-PMMA and 30-1% inks. The ratio between PS-OH and PMMA-OH is typically chosen as the same as the ratio of PS block and PMMA block in the BCP. This type of blend of a BCP with the functionalized polymer inks 220, 225 has been used for molecular transfer printing. In that process the original self-assembled pattern that results after the blend is annealed is copied or transferred to a second top substrate. Molecular transfer printing is described in US20090260750 A1 and S. Ji, et al., "Molecular Transfer Printing Using Block Copolymers", *ACS Nano* 2010, 4, (2) 599-609.

Next in FIG. 2D and the expanded sectional view of FIG. 2E the film 210 is annealed, for example by solvent annealing or heating to 250° C. for at least 10 minutes. This results in a micro-phase separation (e.g., self-assembly into nanoscale domains) and allows the inks to be sequestered or phase separated into respective blocks of PS 240 and PMMA 245 within the BCP. Meanwhile, a fraction of the ink molecules will also react with the substrate regions 207, in this example the grafted PS-r-PMM-OH, thus becoming immobile and creating a pattern with the same geometry and feature size as the BCP pattern of PS 240 and PMMA 245. Since the thickness of BCP film 210 is substantially less than $L_0$, the DSA process window is much wider. For example, defect-free patterns can be achieved with a density multiplication factor greater than 4, with lamellae pitch stretching or compressing for more than 5% for two times density multiplication, or with the width of XPS stripes greater than $0.7L_0$ for two times density multiplication. In comparison, if the film thickness is close to or greater than $L_0$, defective patterns are expected at the same experimental conditions. However, the BCP film 210 is too thin to be useful for subsequent pattern transfer into substrate 200.

After the film 210 has been annealed, it is rinsed in a suitable solvent, for example in a solution of toluene or NMP, to remove the BCP and any functionalized polymers (inks) that are not bound to the substrate regions 207. This leaves the structure depicted in FIG. 2F with a patterned sublayer of stripes 206 of XPS mat material and intermediate regions 250 that contain the self-assembled pattern of bound PS-OH and PMMA-OH shown in the sectional view of FIG. 2E. After rinsing, region 250 will change to 1:1 chemical contrast pattern. If the width of XPS stripes $W \cong 0.5L_0$, the original 1:n chemical contrast pattern is modified to 1:1. In cases of $W \cong 1.5L_0$, $2.5L_0$, or other width greater than $0.5L_0$, the resulted chemical contrast pattern will be a 1:1-like chemical contrast pattern. Overall, the 1:1 chemical contrast pattern in regions 250 will greatly increase the DSA process window in terms of film thickness, density multiplication factor, commensurability tolerance, etc.

In an embodiment of this invention, after the annealed film 210 has been rinsed to leave the structure depicted in FIG. 2F, the steps shown in FIGS. 2B to 2D can be repeated. Specifically, another solution of the BCP blended with homopolymers with functional groups is deposited and annealed, followed by rinsing. This leaves the intermediate regions 250 that contain the self-assembled pattern of bound PS-OH and PMMA-OH shown in the sectional view of FIG. 2F, but the bound PS-OH and PMMA-OH in the regions 250 are now thicker and denser. This process can be repeated multiple times to achieve regions 250 with the desired thickness and density.

Since film 210 is too thin to be useful for pattern transfer, thus in FIG. 2G an additional layer 270 of BCP with a thickness greater than that of layer 210 is deposited, for example by spin-coating, over the patterned sublayer of stripes 206 and regions 250, and the additional layer of BCP is annealed by solvent annealing or by heating to about 250° C. for at least 2 minutes. This additional BCP layer 270 has a thickness preferably in the range of 25 to 200 nm. The underlying pattern of stripes 206 and regions 250 directs the BCP components to self-assemble into PS lines 260 and PMMA lines 265. The PS lines 260 and PMMA lines 265 self-assemble as lamellae perpendicular to the substrate.

If the BCP used in the solution deposited on the patterned sublayer in the step of FIGS. 2B and 2C was blended with the homopolymers of the BCP, e.g., if the BCP contains copolymers A and B and the homopolymers with functional groups are A and B, then this additional layer 270 of BCP is the same BCP. Thus in the example of FIG. 2G, the additional layer 270 of BCP is PS-b-PMMA. However, if the BCP used in the solution deposited on the patterned sublayer in the step of FIGS. 2B and 2C was blended with different homopolymers than are in the BCP, e.g., if the BCP contains copolymers A and B and the homopolymers with functional groups are polymers C and D, then this additional layer 270 is a BCP with polymers C and D.

After the structure shown in FIG. 2G is formed according to embodiments of the method of this invention, one of the BCP components can be removed, leaving the other component as an etch mask for transferring the pattern into substrate 200. These subsequent steps are known in the prior art, for example as shown and described above in FIGS. 1B-1D.

To determine the effect of ink length on the embodiments of the method of this invention, a set of experiments was performed with inks of varying polymer lengths. The PS-r-

PMMA-OH, PS-OH, and PMMA-OH used in the experiments are all end-functionalized, thus the brush length is proportional to the molecular weight. The comparison between the length of PS-r-PMMA-OH and lengths of different inks can be tested by a water contact angle experiment. First, PS-r-PMMA-OH brush is formed on silicon substrates. On each of these substrates, one ink (either PS-OH, or PMMA-OH) with certain molecular weight was additionally grafted. Then the water contact angles of all samples were measured and compared. The contact angle of the original PS-r-PMMA-OH brush layer was 78.5°. If the substrate is additionally grafted by PS-OH with molecular weight of 1.2, 6, 10, or 17 kg/mol, the contact angle was 78.6°, 81.9°, 86.0°, or 89.4°, respectively. The contact angle of PS is ~89°, thus these results show that PS-OH with molecular weight of 17 kg/mol is much longer, PS-OH with molecular weight of 10 kg/mol is slightly longer, while PS-OH with molecular weight of 1.2 or 6 kg/mol is shorter than PS-r-PMMA-OH. The same experiments were carried for PMMA-OH with molecular weight of 9.5 or 30 kg/mol, and the contact angle changed to 73.4°, or 68.3° respectively. PMMA-OH with molecular weight of 30 kg/mol is much longer, while PMMA-OH with molecular weight of 9.5 kg/mol is slightly longer than PS-r-PMMA-OH brush, since the contact angle of PMMA is ~68°.

Another set of experiments was also performed to study the effect of the ink length. A series of identical chemical contrast patterns with density multiplication factors of 2 through 9 were generated. The guiding stripes 206 are XPS lines with width of ~$0.5L_0$. The stripes 207 are PS-r-PMMA-OH containing 50% styrene, which is the same brush used for the previous water contact angle experiments. Four samples of BCP or BCP-inks blend were used for layer 210 in FIG. 2B. Sample-A is pure PS-b-PMMA without inks; Sample-B is 90% PS-b-PMMA, 5% PS-OH with molecular weights of 6 kg/mol and 5% PMMA-OH with molecular weights of 6.5 kg/mol; Sample-C is 90% PS-b-PMMA, 5% PS-OH with molecular weights of 10 kg/mol and 5% PMMA-OH with molecular weights of 9.5 kg/mol; and Sample-D is 90% PS-b-PMMA, 5% PS-OH with molecular weights of 17 kg/mol and 5% PMMA-OH with molecular weights of 30 kg/mol. In all cases, the thickness of layer 210 is ~18 nm. After annealing, as shown in FIG. 2D, defect-free BCP pattern (layer 210) can be achieved on chemical contrast patterns with density multiplication factor up to 6 or 7. Then the layer 210 is rinsed away in NMP, followed by deposition of 30 nm-thick pure BCP layer 270. The BCP layer 270 is then annealed. As a control, when no ink is used in layer 210, the maximum density multiplication factor is only about 3-4. When the inks are shorter than the PS-r-PMMA-OH, the 1:1 chemical contrast pattern cannot form in regions 250, and the maximum density multiplication factor is about 3-4, similar to the control experiment. When the inks are longer than the PS-r-PMMA-OH, the longer molecules extend above the PS-r-PMMA-OH molecules to a height sufficient to allow for binding to the BCP components when the additional layer of BCP is deposited. The 1:1 chemical contrast pattern can form in regions 250 and increase the DSA process window, e.g., the maximum density multiplication factor is 6-7, which is significantly better than the control experiment. Thus in the preferred embodiments the PS-OH and PMMA-OH molecules should be longer than the PS-r-PMMA-OH molecules. The length of a polymer brush highly depends on the chemistry, position of the functional group (at the end of the chain, on the side chain, on the main chain), and number of the functional groups. Typical molecular weight of a polymer brush used for DSA is ~1-100 kg/mol. In cases of using chemical contrast patterns containing bare substrate surface, there is no requirement on the ink length.

Figure 3A:
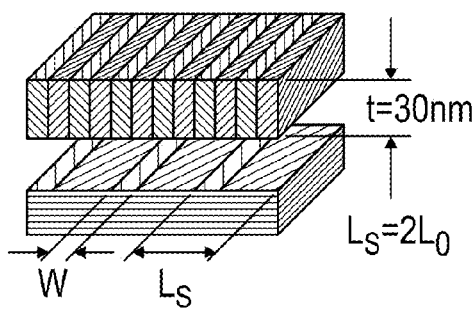
FIG. 3A is a perspective view showing a structure where $L_0=27$ nm and $L_S=2L_0$ with a thickness of the additional BCP layer being about 30 nm.
Figure 3B:
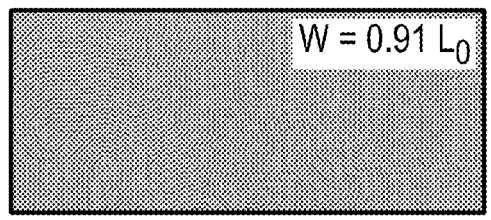
FIG. 3B is a scanning electron microscopy (SEM) image of a top view of the structure of FIG. 3A but made according to the prior art method of DSA.
Figure 3C:
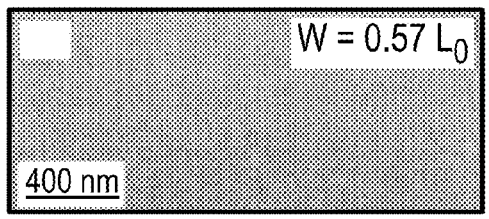
FIGS. 3C-3H are SEM images of a top view of structures made according to an embodiment of the method of this invention for values of W of $0.57L_0$, $0.69L_0$, $0.83L_0$, $0.93L_0$, $1.01L_0$ and $1.09L_0$, respectively.
Figure 3D:
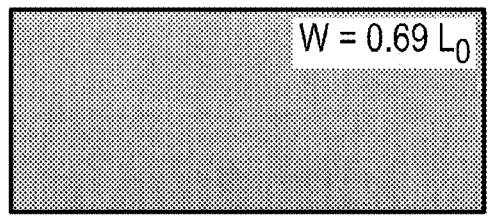
Figure 3E:
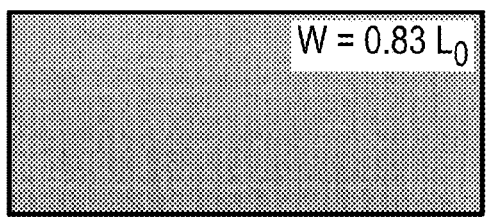
Figure 3F:
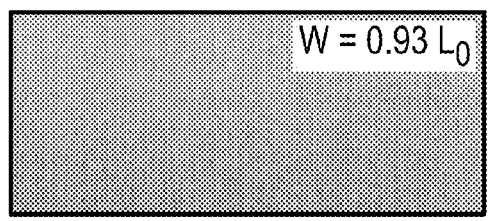
Figure 3G:
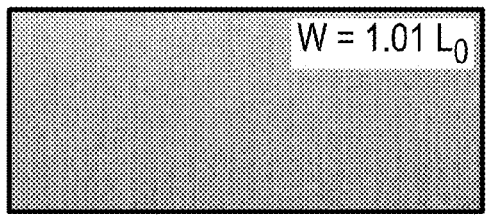
Figure 3H:
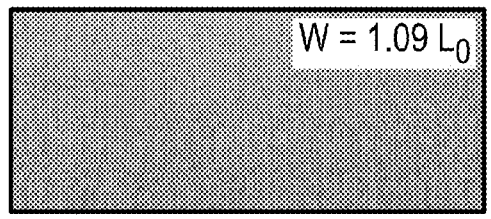

DSA of BCP films with thickness greater than $L_0$ on chemical contrast patterns with wider range of W was demonstrated according to embodiments of the method of this invention. FIG. 3A is a perspective view of showing a structure where $L_0$=27 nm and $L_S$=$2L_0$ with a thickness of the additional BCP layer being about 30 nm (equivalent to FIG. 2G). FIG. 3B is a scanning electron microscopy (SEM) image of a top view of this structure but made according to the prior art method of DSA, and clearly shows that the completed lines of PS and PMMA are not close to being parallel over any extended length. In contrast, FIGS. 3C-3H are SEM images of a top view of structures made according to embodiments of the method of this invention for values of W of $0.57L_0$, $0.69L_0$, $0.83L_0$, $0.93L_0$, $1.01L_0$ and 1.094, respectively. The inks used here were 5% PS-OH with molecular weights of 10 kg/mol and 5% PMMA-OH with molecular weights of 9.5 kg/mol. As shown, for FIGS. 3C-3F, all of the lines are nearly perfectly parallel without defects over an extended length.

Figure 4A:
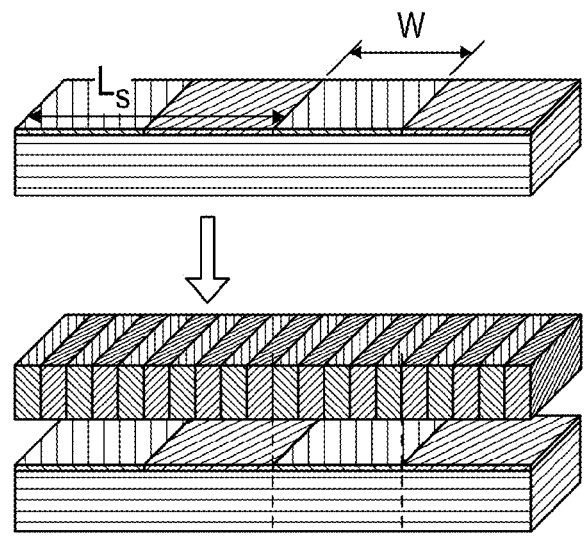
FIG. 4A is a perspective view showing a structure where $L_0=27$ nm, $L_S=5L_0$, $W=2.5L_0$ and with a thickness of the additional BCP layer being about 30 nm.
Figure 4B:
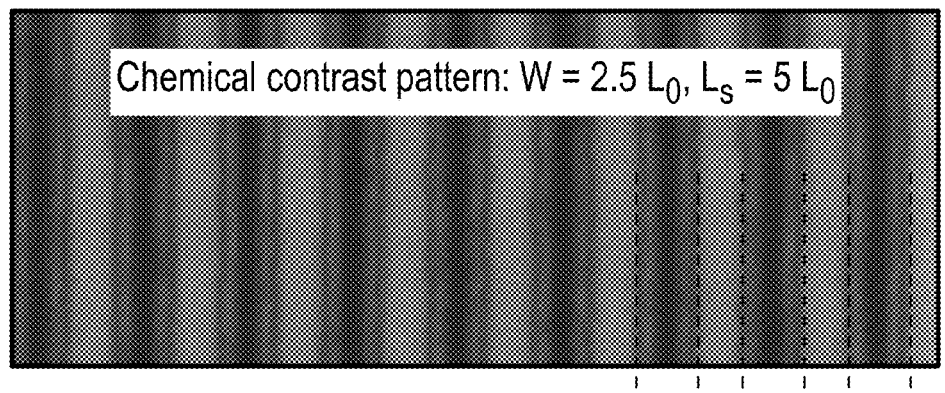
FIG. 4B is a SEM image of a top view of the patterned and etched e-beam resist with cross-linked polystyrene XPS stripes underneath, showing the geometry of the chemical contrast patterns with $L_S=135$ nm and $W\cong67.5$ nm.
Figure 4C:
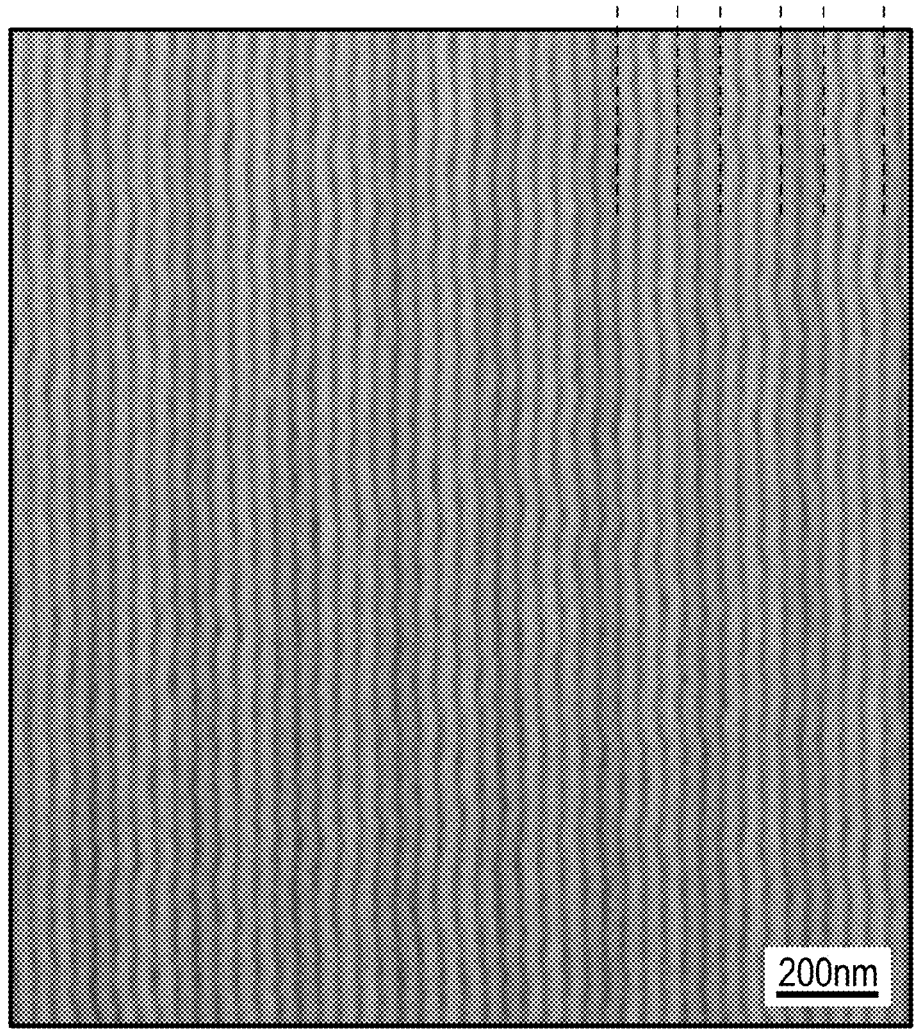
FIG. 4C is a SEM image of a top view of the additional BCP layer with alternating parallel PS and PMMA lines.
Figure 4D:
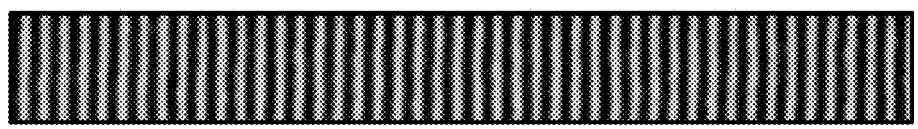
FIG. 4D is a SEM image of chromium (Cr) lines formed by removal of the PMMA lines and dry lift-off using the remaining PS lines as a mask.

Previous studies have shown that DSA works well when the width of the XPS guiding stripes W≅$0.5L_0$ or $1.5L_0$, with 1 PS lamellae or 2 PS lamellae and 1 PMMA lamellae on top of the XPS guiding stripes, respectively. According to embodiments of the method of this invention, DSA works well also when W≅$2.5L_0$, with 3 PS lamellae and 2 PMMA lamellae on top of the XPS guiding stripes. FIG. 4A is a perspective view showing a structure where $L_0$=27 nm, $L_S$=$5L_0$, W=$2.5L_0$, n=5 and with a thickness of the additional BCP layer being about 30 nm. FIG. 4B is a SEM image of a top view of the oxygen plasma etched e-beam resist pattern with XPS stripes (206 in FIG. 2A) underneath. The resist pattern is then rinsed away and the intermediate regions between stripes 206 are then grafted with PS-r-PMMA-OH brush (stripes 207). FIG. 4C is a SEM image of a top view of the additional BCP layer (layer 270 in FIG. 2G) with alternating parallel PS lines and PMMA lines. FIG. 4D is a SEM image of chromium (Cr) lines formed by removal of the PMMA lines, deposition of a Cr layer, and dry lift-off of the Cr lines on top of the PS lines. FIGS. 4A-4D illustrate that embodiments of the method of the invention can be used to form generally parallel lines in a substrate for a relatively large stripe width (W=$2.5L_0$) and a relatively large density multiplication factor (n=5). Based on these experimental results it is believed that W can have a width up to one-half the density multiplication factor times $L_0$, i.e., W=$(n/2)L_0$.

Figure 5A:
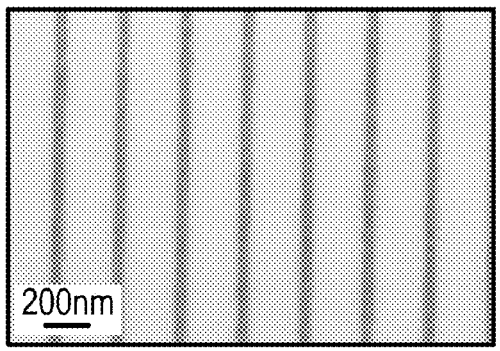
FIG. 5A is a SEM image of a top view of the patterned and etched e-beam resist with (XPS) stripes underneath, showing the geometry of the chemical contrast patterns with $L_S=272.4$ nm, $W=19$ nm.
Figure 5B:
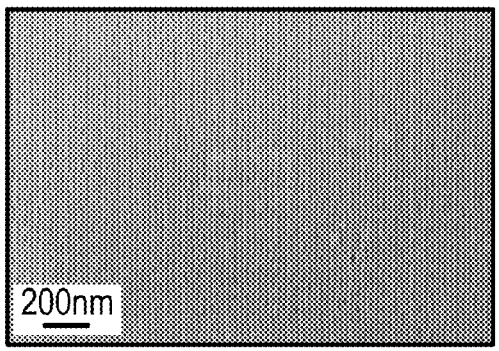
FIG. 5B is a SEM image of a top view of the additional BCP layer with a thickness of about 30 nm on chemical contrast patterns with $L_S=266.1$ nm.
Figure 5C:
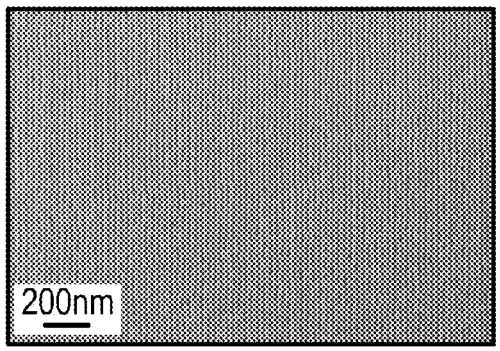
FIG. 5C is a SEM image of a top view of the additional BCP layer with a thickness of about 30 nm on chemical contrast patterns with $L_S=268.2$ nm.
Figure 5D:
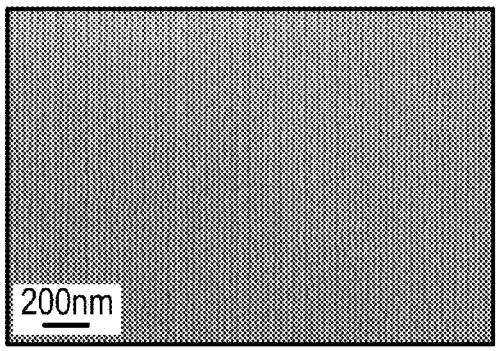
FIG. 5D is a SEM image of a top view of the additional BCP layer with a thickness of about 30 nm on chemical contrast patterns with $L_S=270.0$ nm.
Figure 5E:
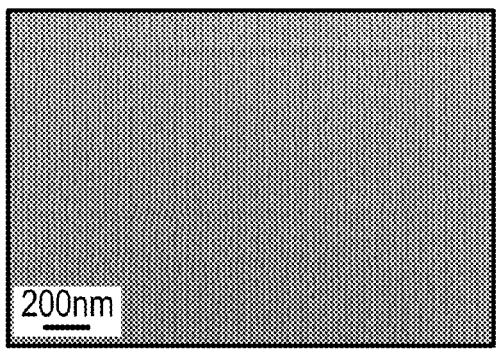
FIG. 5E is a SEM image of a top view of the additional BCP layer with a thickness of about 30 nm on chemical contrast patterns with $L_S=272.4$ nm.
Figure 5F:
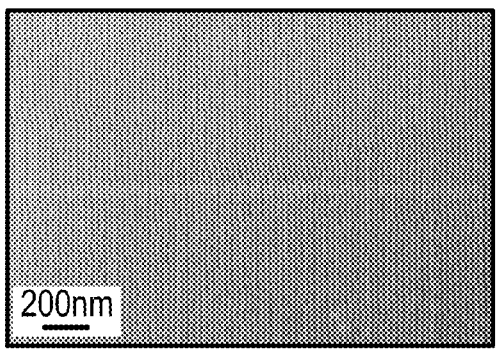
FIG. 5F is a SEM image of a top view of the additional BCP layer with a thickness of about 30 nm on chemical contrast patterns with $L_S=274.2$ nm.

DSA with a high density multiplication factor was demonstrated according to embodiments of the method of this invention. A series of chemical contrast patterns with density multiplication factors of 10 were generated. The chemical contrast patterns have similar XPS guiding width W of 18-20 nm, identical PS-r-PMMA-OH brush as stripes 207, but various $L_s$ values of 266.1, 268.2, 270, 272.4, and 274.2 nm. FIG. 5A is a SEM image of a top view of the oxygen plasma etched e-beam resist pattern that was used to create the chemical contrast pattern. FIGS. 5B-5F are top-down SEM images of the additional BCP layer (layer 270 in FIG. 2F) guided by chemical contrast patterns with $L_s$ of 266.1, 268.2, 270, 272.4, and 274.2 nm, respectively. Nearly perfect BCP patterns are observed on chemical contrast patterns with $L_s$ of 266.1, 268.2, 270, and 272.4 nm. When $L_s$ is 274.2 nm, a defective BCP pattern is observed.

Figure 6A:
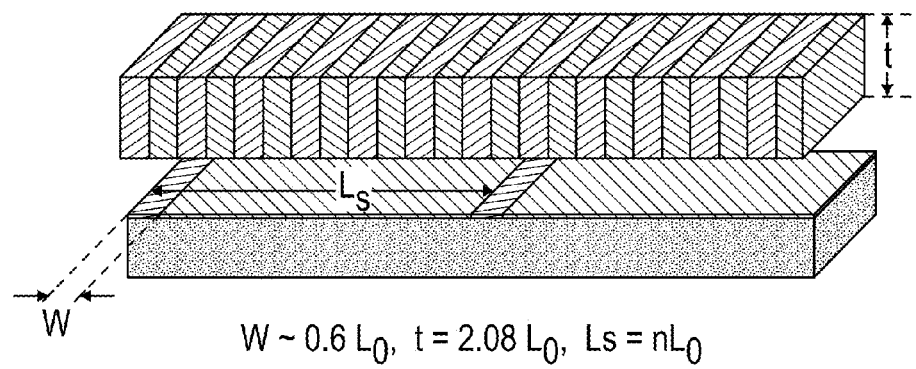
FIG. 6A is a perspective view showing a structure where $L_0=27$ nm, $L_S=nL_0$, $W=0.6L_0$ and with a thickness of the additional BCP layer being about 2.08 $L_0$.
Figure 6B:
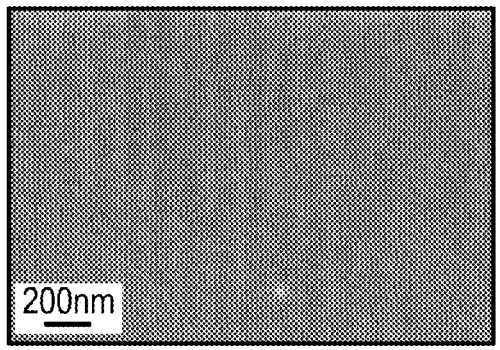
FIG. 6B is a SEM image of a top view of the additional BCP layer with a thickness of about 56.25 nm on chemical contrast patterns with $L_S=162$ nm.
Figure 6C:
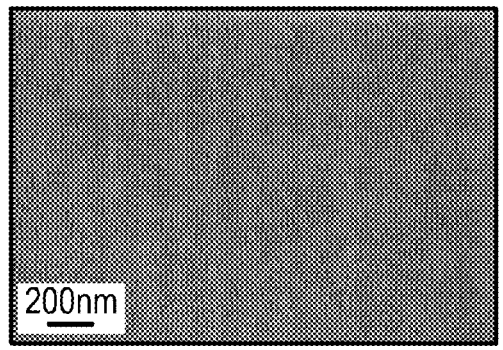
FIG. 6C is a SEM image of a top view of the additional BCP layer with a thickness of about 56.25 nm on chemical contrast patterns with $L_S=189$ nm.

Formation of a BCP layer with a thickness more than $2L_0$ on chemical contrast patterns with high density multiplication factor was demonstrated according to embodiments of the method of this invention. FIG. 6A is a perspective view showing a structure where $L_0$=27 nm, $L_S$=$nL_0$, W≅$0.6L_0$ and with a thickness of the additional BCP layer being about 2.08$L_0$. FIGS. 6B and 6C are top-down SEM images of the additional BCP layer (layer 270 in FIG. 2F) with a thickness of 56.25 nm guided by chemical contrast patterns with $L_s$ of 162 and 189 nm, respectively.

Thus the use of the thin film of bound self-assembled PS-OH and PMMA-OH as the patterned sublayer for the subsequent DSA of the additional BCP layer allows for a large design process window. A wide range of density multiplication factors and stripe widths can be used in the DSA to form nearly perfectly parallel lines of PS and PMMA with minimal defects.

While embodiments of the invention described and illustrated above have used chemoepitaxy, i.e., wherein the patterned sublayer 205 in FIG. 2A is a chemical contrast pattern, the invention is fully applicable to graphoepitaxy, wherein the patterned sublayer is a topographic pattern. An embodiment of the method of this invention using a topographic pattern as the patterned sublayer is illustrated in FIGS. 7A-7H.

Figure 7A:
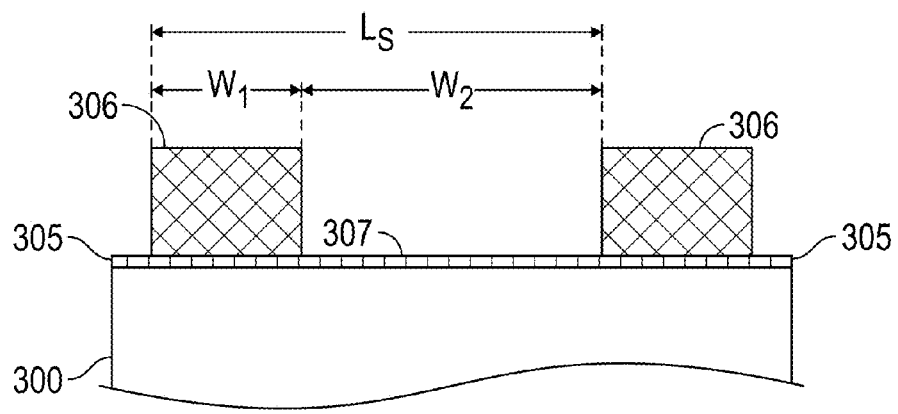
FIGS. 7A-7H are sectional views of an embodiment of the method of this invention using a topographic pattern as the patterned sublayer.

FIG. 7A is a perspective view of a substrate 300 with a patterned sublayer 305 that acts as a topographic pattern. In FIG. 7A a first layer 305 is deposited on the substrate 300, followed by deposition and patterning of a photoresist layer into stripes 306. In case of the DSA of perpendicularly oriented lamellae, this results in a patterned topographic sublayer that is typically a periodic pattern of generally parallel stripes 306 alternated by stripes 307. The width of each stripe 306 ($W_1$) and each stripe 307 ($W_2$) are $W_1 \sim nL_0$ and $W_2 \sim mL_0$, respectively, and the pitch of the stripes 306 is $L_s \sim (n+m)L_0$, where n and m are integers greater than or equal to 1. The sidewalls of the stripes 306 are formed of a material that is preferentially wetted by one of the blocks of the BCP. The chemistry of the alternate stripes 307 is generally neutral to the blocks. Because the stripes 306 are taller than the stripes 207, the pattern is referred to as a topographic pattern, and the method for forming the BCP patterns is referred to as graphoepitaxy.

In the prior art, there are various types of topographic patterns specifically for PS-b-PMMA, which means different pairing of 306 and 307 stripes. For example, the 306 stripes can be a cross-linked PMMA mat, cross-linked polystyrene (XPS), e-beam resist HSQ (hydrogen silsesquioxane), photoresist, anti-reflection coating, or a material like silicon, silicon nitride, silicon oxide, gold or carbon. The layer 305 and thus the stripes 307 can be a neutral functionalized random copolymer PS-r-PMMA brush or mat.

Referring again to FIG. 7A, in the present example, a layer 305 of random copolymer PS-r-PMMA brush with a thickness of 3-8 nm is first formed on a silicon substrate, followed by deposition of an e-beam resist layer on top to a thickness between about 20 to 200 nm. After the resist is exposed by e-beam lithography and developed, a topographic pattern of resist stripes 306 and underlying stripes 307 is formed with a stripe pitch $L_S$ of approximately $(n+m)L_0$. The e-beam resist, for example hydrogen silsesquioxane (HSQ), may serve as the topographic features or stripes 306. The topographic features 306 may also be formed by transferring the e-beam resist pattern to another material. The width of the stripes 306 and 307 can be tuned by e-beam doses and/or additional wet etching.

Figure 7B:
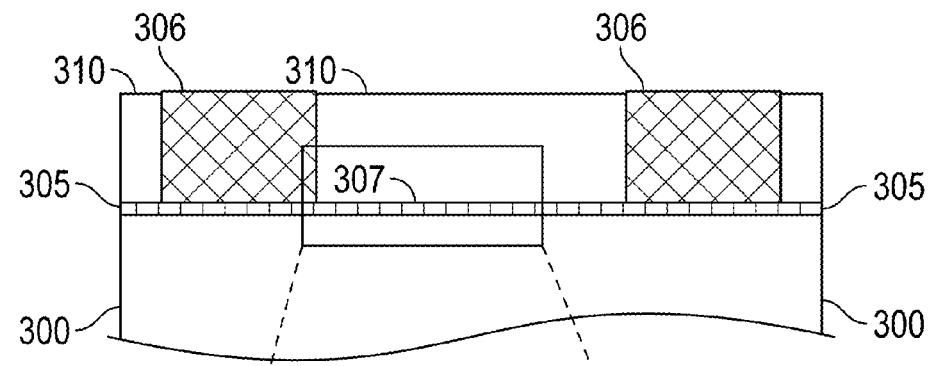
Figure 7C:
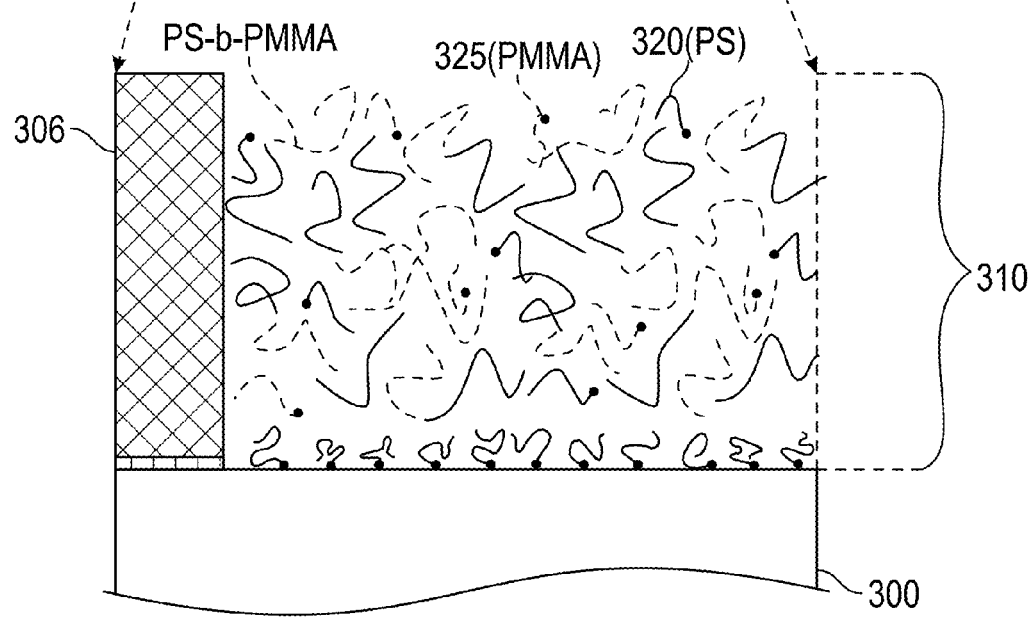

Next, in FIG. 7B and the expanded sectional view of FIG. 7C a solution of a BCP blended with homopolymers with functional groups is deposited, for example by spin-coating, as a thin film 310 onto the stripes 307 of the topographic pattern. Preferably the homopolymers with functional groups are the same as the polymers in the BCP and the functional groups are functional end groups. The preferred BCPs are PS-b-PMMA and polystyrene block poly 2-vinylpyridine (PS-b-P2VP). The preferred functional groups for the homopolymers are hydroxyl (OH) and amine ($NH_2$). This layer is deposited to a thickness that is comparable to the height of stripes 306. The functionalized homopolymers are sometimes called "inks" because they are added to the blend.

In the example of FIGS. 7A-7H, the BCP is PS-b-PMMA and the homopolymers are OH-terminated PS (item 320) and OH-terminated PMMA (item 325). The blend may be made up of 70-99% PS-b-PMMA and 30-1% inks. The ratio between PS-OH and PMMA-OH is typically chosen as the same as the ratio of PS block and PMMA block in the BCP.

Figure 7D:
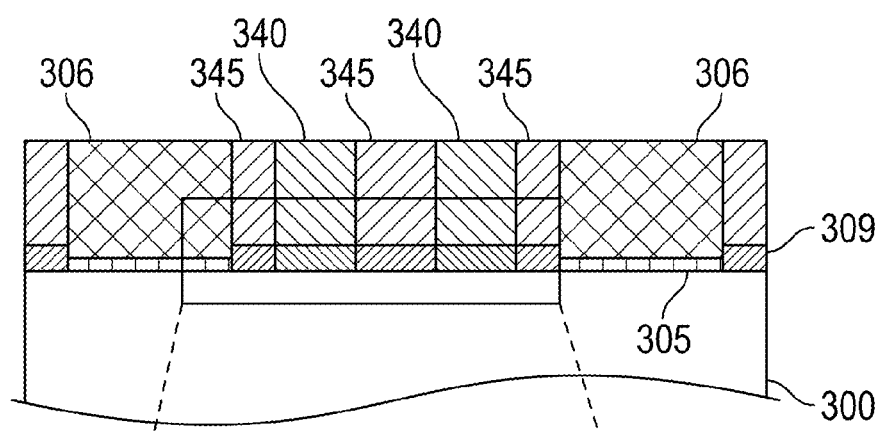
Figure 7E:
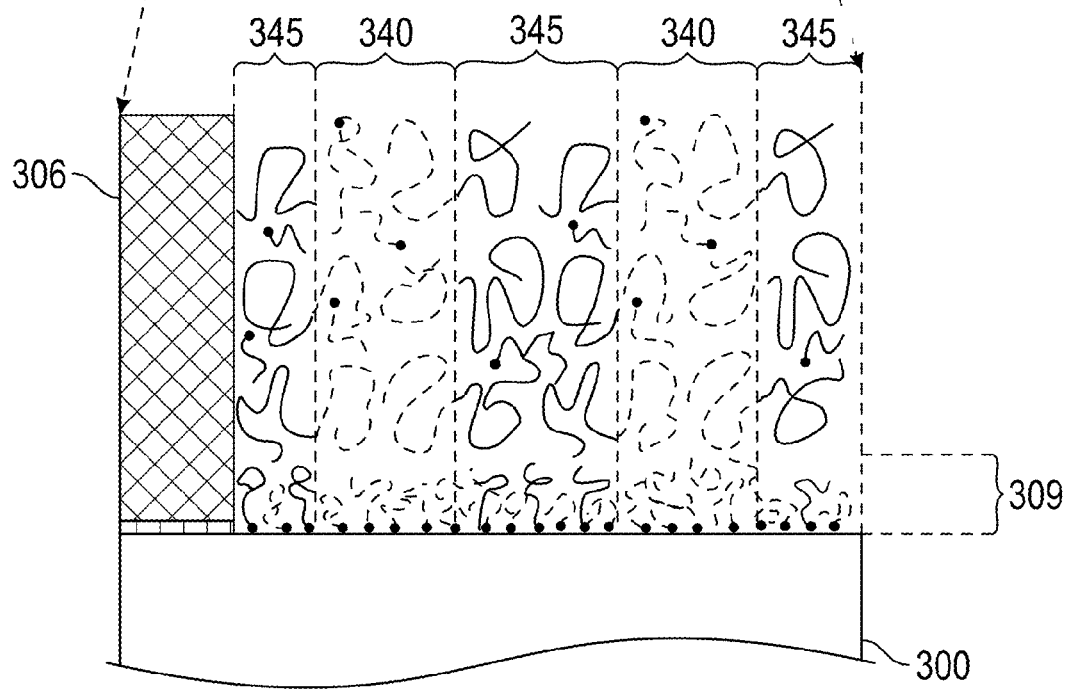

Next in FIG. 7D and the expanded sectional view of FIG. 7E the film 310 is annealed, for example by solvent annealing or by heating to 250° C. for at least 10 minutes. This results in a micro-phase separation (e.g., self-assembly into nanoscale domains) and allows the inks to be sequestered or phase separated into respective blocks of PS 340 and PMMA 345 within the BCP. Because the sidewalls of the HSQ are polar, the more polar PMMA is attracted to the sidewalls of stripes 306. If the stripes 306 were formed of a cross-linked PMMA mat, the sidewalls would attract the PMMA. This causes the PMMA 345 and PS 340 to self-assemble between the sidewalls of adjacent stripes 306, as shown in FIG. 7E. Meanwhile, a fraction of the ink molecules will also react with the substrate 200 in the regions 207. This results in a layer 209 of predominantly grafted inks, but also grafted brush, in this example the grafted PS-r-PMMA-OH, having a pattern with the same geometry and feature size as the BCP pattern of PS 340 and PMMA 345. Since the DSA is guided by a topographic pattern, defect-free patterns can be achieved with a density multiplication factor greater than 4. However, perfect DSA can't be obtained on top of the topographic stripes 306.

After the film 310 has been annealed, it is rinsed in a suitable solvent, for example toluene or NMP, to remove the BCP and any functionalized polymers (inks) that are not bound to the substrate regions 307. This leaves the structure depicted in FIG. 7F with a patterned sublayer of stripes 306 and intermediate regions 350 that contain the self-assembled pattern of bound PS-OH (360) and PMMA-OH (365). After rinsing, region 350 will change to 1:1 chemical pattern.

Figure 7F:
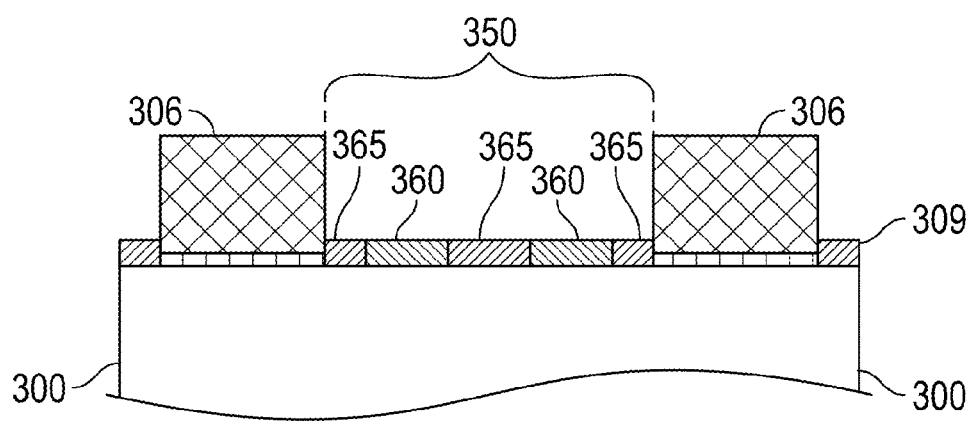

In an embodiment of this invention, after the annealed film 310 has been rinsed to leave the structure depicted in FIG. 7F, the steps shown in FIGS. 7B to 7D can be repeated. Specifically, another solution of the BCP blended with homopolymers with functional groups is deposited and annealed, followed by rinsing. This leaves the intermediate regions 350 that contain the self-assembled pattern of bound PS-OH and PMMA-OH shown in the sectional view of FIG. 7F, but the bound PS-OH and PMMA-OH in the regions 350 are now thicker and denser. This process can be repeated multiple times to achieve regions 350 with the desired thickness and density.

Figure 7G:
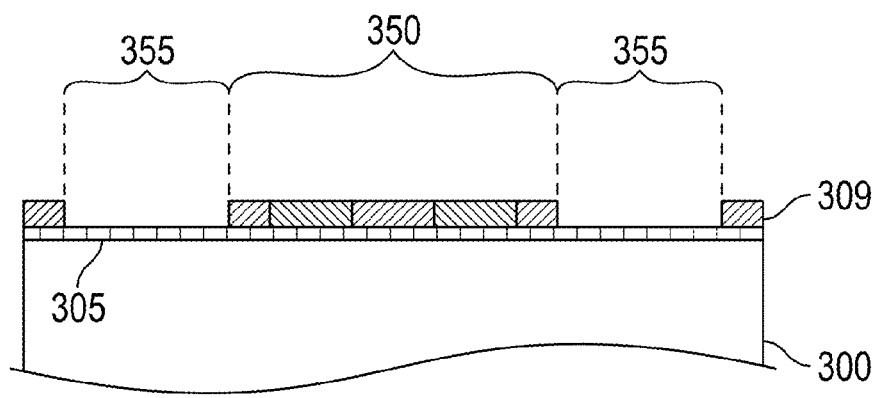

The stripes 306 can then be removed by be rinsing in a suitable solvent, for example in an aqueous solution of sodium hydroxide if the stripes 306 are HSQ. The resulting pattern will have the 1:1 chemical pattern in regions 350 and neutral brush in regions 355 (FIG. 7G).

Figure 7H:
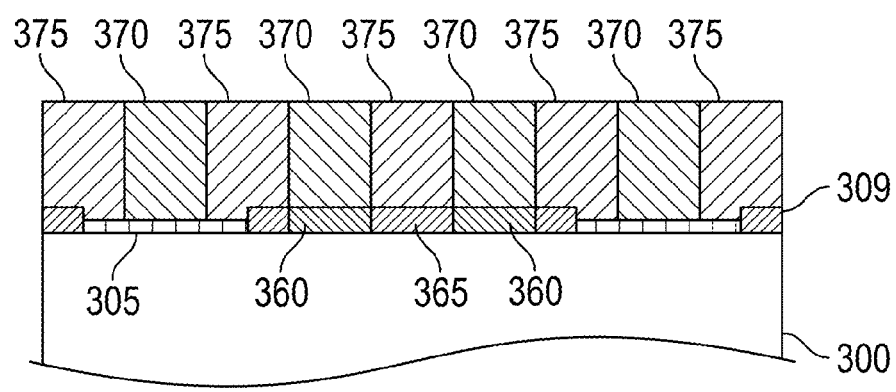

In FIG. 7H an additional layer of BCP is deposited, for example by spin-coating, and the additional layer of BCP is annealed by solvent annealing or by heating to about 250° C. for at least 2 minutes. This causes the PS lines 370 to form on the PS-OH 360 and the PMMA lines 375 to form on the PMMA-OH 365 in the 1:1 chemical contrast pattern in regions 350. The underlying pattern of neutral brush in regions 355 where the stripes 306 were previously located directs the BCP components to self-assemble into PS lines 370 and PMMA lines 375. The PS lines 370 and PMMA lines 375 self-assemble as lamellae perpendicular to the substrate. If the stripes 306 were not removed in the step shown in FIG. 7G, then they would remain and the PS lines 370 and PMMA lines 375 would form only in the regions 350 between the stripes 306. In that case the width $W_1$ of the stripes 306 does not need to be controlled to have a width of approximately $nL_0$, and the stripe pitch of the first stripes is then $L_s \sim W_1 + mL_0$.

If the BCP used in the solution deposited on the patterned sublayer in the step of FIGS. 7B and 7C was blended with the homopolymers of the BCP, e.g., if the BCP contains copolymers A and B and the homopolymers with functional groups are A and B, then this additional layer 370 of BCP is the same BCP. Thus in the example of FIG. 7H, the additional layer 370 of BCP is PS-b-PMMA. However, if the BCP used in the solution deposited on the patterned sublayer in the step of FIGS. 7B and 7C was blended with different homopolymers than are in the BCP, e.g., if the BCP contains copolymers A and B and the homopolymers with functional groups are polymers C and D, then this additional layer 370 is a BCP with polymers C and D.

After the structure shown in FIG. 7H is formed according to embodiments of the method of this invention, one of the BCP components can be removed, leaving the other component as an etch mask for transferring the pattern into substrate 300. These subsequent steps are known in the prior art, for example as shown and described above in FIGS. 1C-1E.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method of directed self-assembly (DSA) of a block copolymer (BCP) having a natural pitch $L_0$ comprising:
    providing a substrate;
    forming on the substrate a patterned sublayer with generally parallel stripes having a stripe pitch $L_s$ of approximately $nL_0$, where n is an integer greater than or equal to 1;
    depositing on the patterned sublayer a solution comprising a first BCP of polymers A and B without functional groups, a polymer C with a functional group and a polymer D with a functional group;
    annealing said deposited solution to cause polymers C and D to self assemble and bind to the patterned sublayer;
    removing the first BCP and unbound polymers, leaving the self-assembled bound polymers C and D;
    repeating the steps of depositing said solution, annealing said deposited solution and removing the first BCP and unbound polymers;
    depositing on the self-assembled bound polymers C and D a layer of a second BCP of polymers C and D without functional groups; and
    annealing said layer of second BCP to cause DSA of the second BCP into alternating lines of polymers C and D, said alternating lines having a line pitch of approximately $L_0$.

2. The method of claim 1 wherein forming a patterned sublayer comprises forming a chemical contrast pattern.

3. The method of claim 1 wherein forming a patterned sublayer comprises forming a topographic pattern, wherein the stripes have sidewalls that preferentially wet one of the first BCP blocks.

4. The method of claim 1 wherein polymer A is identical to polymer C and polymer B is identical to polymer D, whereby the first BCP is identical to the second BCP.

5. The method of claim 1 wherein the polymers C and D with functional groups are copolymers of a BCP.

6. The method of claim 1 wherein polymer A is polystyrene (PS), polymer B is poly(methyl methacrylate) (PMMA), polymer C is PS and polymer D is poly 2-vinylpyridine (P2VP).

7. The method of claim 1 wherein polymer A is PS, polymer B is P2VP, polymer C is PS and polymer D is PMMA.

8. The method of claim 1 wherein n is greater than or equal to 2 and less than or equal to 10.

9. The method of claim 1 wherein the functional groups are selected from OH and $NH_2$.

10. The method of claim 1 further comprising, after annealing said layer of second BCP to cause DSA of the BCP into alternating lines of polymers C and D, patterning the substrate using the lines of one of polymers C and D as a mask.

11. The method of claim 1 wherein providing a substrate comprises providing a substrate selected from silicon-on-insulator (SOI), single-crystal Si, amorphous Si, silica, fused quartz, silicon nitride, carbon, tantalum, molybdenum, chromium, alumina and sapphire.

12. The method of claim 1 wherein providing a substrate comprises providing an intermediate layer formed on a base selected from a semiconductor wafer and silicon-on-insulator (SOI).

13. The method of claim 1 wherein said alternating lines of first and second polymers form a pattern selected from parallel generally straight lines, generally radial lines, and generally concentric circular lines.

14. A method of forming parallel generally straight lines on a substrate selected from a semiconductor wafer and silicon-on-insulator (SOI) using directed self-assembly (DSA) of a block copolymer (BCP) having a natural pitch $L_0$ comprising:
    forming on the substrate a patterned sublayer of first and second alternating generally parallel stripes, the second stripes having a stripe width of approximately $mL_0$, where m is an integer greater than or equal to 1;
    depositing on the second stripes a solution comprising a first BCP of polymers A and B without functional groups, a polymer C with a functional group and a polymer D with a functional group;
    annealing said deposited solution to cause polymers C and D to self assemble and bind to the second stripes;
    removing the first BCP and unbound polymers, leaving the self-assembled bound polymers C and D;
    repeating the steps of depositing said solution, annealing said deposited solution and removing the first BCP and unbound polymers;
    depositing on the self-assembled bound polymers C and D a layer of a second BCP of polymers C and D without functional groups;
    annealing said layer of second BCP to cause DSA of the second BCP into lamellae perpendicular to the sublayer as alternating lines of polymers C and D, said alternating lines having a line pitch of approximately $L_0$; and
    patterning said layer of material using the lines of one of polymers C and D as a mask, leaving parallel generally straight lines of said material.

15. The method of claim 14 further comprising depositing an intermediate layer on the substrate prior to forming said patterned sublayer.

16. The method of claim 14 wherein forming a patterned sublayer comprises forming a topographic pattern, wherein the first stripes have a height higher than the second stripes and sidewalls that preferentially wet one of the BCP blocks.

17. The method of claim 16 wherein the first stripes have a stripe width of approximately $nL_0$, where n is an integer greater than or equal to 1, and wherein the first stripes have a stripe pitch $L_s$ of approximately $(n+m)L_0$.

18. The method of claim 16 wherein forming the topographic pattern comprises depositing a layer of polymer brush material on the substrate, depositing resist on the polymer brush material, patterning the resist by lithography, and developing the exposed resist, wherein the topographic pattern comprises first stripes of resist and second stripes of polymer brush material between said first stripes.

19. The method of claim 14 wherein polymer A is identical to polymer C and polymer B is identical to polymer D, whereby the first BCP is identical to the second BCP.

20. The method of claim 19 wherein polymer A is polystyrene (PS), polymer B is poly(methyl methacrylate) (PMMA), the first polymer having a functional group is PS-OH and the second polymer having a functional group is PMMA-OH.

* * * * *